United States Patent [19]

Smith

[11] 3,954,217
[45] May 4, 1976

[54] METHOD AND APPARATUS FOR BONDING AND BREAKING LEADS TO SEMICONDUCTORS

[75] Inventor: Michael C. Smith, Costa Mesta, Calif.

[73] Assignee: Orthodyne Electronics, Costa Mesa, Calif.

[22] Filed: Sept. 30, 1974

[21] Appl. No.: 510,417

[52] U.S. Cl. .................................. 228/110; 228/1
[51] Int. Cl.² ......................................... B23K 1/06
[58] Field of Search .................. 29/470.1; 228/1, 3, 228/3.1, 110, 111

[56] References Cited
UNITED STATES PATENTS

3,087,239    4/1963    Clagett.............................. 29/471.1
3,627,192    12/1971   Killingsworth..................... 228/1 X Primary Examiner—James L. Jones, Jr.
Assistant Examiner—Margaret Joyce
Attorney, Agent, or Firm—Richard L. Gausewitz

[57] ABSTRACT

The second wire bond is made in a semiconductor circuit simultaneously with breaking of the wire, in such manner that a "tailless" wirebond is achieved in minimum time and with no damage to either the wire or the bonding pad. The bond is made ultrasonically, and tension is applied to the wire during the actual time that ultrasonic bonding energy is supplied to the bonding tool. Such tension is applied by a spring or its equivalent, and is so predetermined that application of the bonding energy to the bonding tool will not only create the ultrasonic bond but will also break the wire.

37 Claims, 11 Drawing Figures

METHOD AND APPARATUS FOR BONDING AND BREAKING LEADS TO SEMICONDUCTORS

BACKGROUND OF THE INVENTION

1. Field of the Invention

This invention relates to the bonding of wires to objects by means of ultrasonic bonding wedges. The invention has particular utility, for example, in the bonding and breaking of "larger" diameter wire used in semiconductor circuits.

2. Description of Prior Art

There are two kinds of bonding generally employed in making wire connections in semiconductor microcircuitry (such circuitry primarily comprising extremely small "chips" which incorporate very large numbers of transistors and other components, and which are readily discernible only through a microscope). The first kind is thermocompression bonding, and the second is ultrasonic bonding. Thermocompression bonding, wherein each bond is made by application of heat and pressure, is conventionally limited in its application because it is usually restricted to wires made of gold. Ultrasonic bonding is more important and has a much wider application, being usable with respect to various metals including (for example) aluminum, gold, platinum, copper and nickel. The two types of bonding are thus distinctly different from each other not only in manner of operation but in field of use. The present invention relates only to the second type, namely ultrasonic.

U.S. Pat. No. 3,460,238, assigned to Motorola, Inc., describes an ultrasonic bonding apparatus wherein the bonding wedge (the tool portion which actually engages the wire) is itself employed to break the wire after completion of formation of the second ultrasonic bond. This is accomplished by re-engaging the wedge with a wire portion adjacent the already-completed second bond, and then shifting the wedge away from the bond so that frictional forces will apply tension to the wire and thus break it.

As stated in column 1 of such U.S. Pat. No. 3,460,238, "it is necessary to sever the wire after making one of the two bonds. To date, such wire severing has been performed by apparatus such as clamps which may pull the wire for breaking it at the bonding area. Other bonding machines include a scissors type of operation for cutting the wire immediately adjacent to the bond area which may leave a short undesirable tab at the bonding area."

An example of the "pulling" approach to post-bonding wire breaking is to be found in General Motors U.S. Pat. No. 3,689,983, column 5, which states: "The unbonded wire may be separated from the interconnection leaving a tailless bond by a method now to be described. While the tip remains in pressing engagement with bond 30 of the final bond of an interconnection, the unbonded wire can be pulled along channel 44 and groove 41. It has been found that the separation occurs generally within a portion of the bond underlying the groove area. Accordingly, a portion designated 46 of the bond 30 is thus removed, providing a tailless bond."

An example of both the pulling and the "scissors" approach to post-bonding wire breaking is to be found in IBM U.S. Pat. No. 3,646,307, column 7, where it is stated: "If any last bonds terminate an interconnection, feeding tip 80 is retracted with the wires clamped until sufficient force is exerted to break the wires off adjacent bond tip 134. Provision for notching wires adjacent bonding tip 134 may be made when the nature of the wires is such that they do not easily break off."

U.S. Pat. No. 3,087,239, assigned to Western Electric, teaches the use of a scissors device 13 in a thermocompression bonding apparatus, such patent stating (column 2) that "the invention is not limited to the forming of thermo-compression bonds only. For example, mechanical vibrations at ultrasonic frequencies may be utilized as a bonding aid in place of the heat employed in the instant embodiment." As an alternative to the scissors device 13, the patent (column 3) states: "Other means for shearing lead 12 may be utilized. For example, referring to FIG. 1C, pressure greater than that required to provide a bond may be applied by tip 17 thereby to bond and break through the lead in one step. Shearing device 13 is preferred, however, because it combines the shearing and orienting steps."

There are various major disadvantages to the above-mentioned (and other) approaches used by prior-art workers, particularly when larger diameter wires are being bonded (as is the case, for example, in semiconductor power circuitry). The word larger is placed in quotation marks because the wire may still be extremely small, for example about two to four thousandths of an inch in diameter. It is to be understood that the present invention is also applicable to wires having diameters much larger than four thousandths of an inch.

Relative to post-bonding pulling methods of wire breaking, these tend to damage the wire in one or both of two locations—at the bond and/or at the wire clamp. If the wire clamp, for example, clamps sufficiently tightly to pull adequately on the larger diameter wires, without slipping, there may result marks or nicks, etc., at the point of clamping. Such marks or nicks are believed by the present inventor to be responsible for service problems because they localize stress and—during temperature cycling—may propagate cracks leading to failure of the wire. Similarly, if the bonding wedge is clamped down on the previously-formed bond with sufficient force to prevent it from pulling loose in response to tensioning of the wire, there may result deleterious marks and nicks at the upper regions of the bonded wire end.

Relative to the shearing or scissors approach to wire breaking, there are different problems depending upon what type of shearing is employed. If the shearing is removed from the bond, there is a "tail" adjacent the bond which is distinctly undesirable. Tailless wire bonding has therefore been extensively performed by means of a chopper blade located just ahead of the front edge of the bonding wedge. After competion of the second bond, the wedge is lifted and moved back the length of the bond. At this point, the chopper blade moves down and severs the wire at the back of the bond. Such chopping, however, creates shear forces which are transmitted to the bond and may damage it.

It is emphasized that no system for breaking the wire should be such as to injure the underlying element (usually a pad or post) to which the wire is being bonded. Therefore, and to minimize dulling of the blade, chopper blades are usually—insofar as it can be accomplished—so adjusted that they never cut completely through the wire. In practice, however, such adjustment is difficult because of manufacturing tolerances which exist relative to the placing of the bonding plane.

Insofar as applicant is aware, all commercially used wire-breaking steps follow the bonding step. They therefore slow the operation, requiring a portion of the machine cycle time. The above-cited U.S. Pat. No. 3,087,239, which relates primarily to thermocompression welding, would if the stated "other means" (column 3, first full paragraph) were employed tend to cause squashing of the bond and injury to the underlying pad or post.

There has long existed a clear need for fast severing of ultrasonically bonded wires in a tailless manner, with no substantial possibility of injury to the wire or the work. This need is evidenced by a study of the above-mentioned (and other) prior-art patents.

SUMMARY OF THE INVENTION

The present method and apparatus satisfy the above-stated need by applying a predetermined tension to the wire during the time that ultrasonic energy is being supplied to effect the final ultrasonic bond. The tension is caused to be such that:

a. It will not pull the wire from beneath the bonding wedge prior to or during bonding, the wedge pressure being that required to effect an optimum-quality ultrasonic bond.

b. It will not break the wire prior to bonding.

c. It can be applied without application of wire clamp forces which may injure the wire.

d. It will cause the wire to break in tailless manner, immediately adjacent the bonding wedge, during application of the ultrasonic vibrations necessary to achieve an optimum bond.

The amount of force required for clamping the wire, and pulling the wire, are very much less than in prior-art devices and methods wherein pulling is effected after completion of the second bond. Because the wire breaks during the actual ultrasonic bonding step, no time is required for wire breaking. Because nothing moves to a position close to the underlying pad or post, there is no chance that such can be injured.

The present method and apparatus employ a spring or its equivalent to produce the predetermined tension or "preload" on the wire. Exact values of such tension or preload are readily determined empirically, by following the teachings of the present patent specification. Such exact values are functions of such factors as (1) wire material, type and hardness, (2) pulling angle, (3) the shape of the lower end of the bonding wedge, (4) the amplitude and frequency of the ultrasonic vibration, and (5) the downward pressure exerted by the bonding wedge.

DETAILED DESCRIPTION OF THE PREFERRED EMBODIMENT

The organization with which applicant is associated is presently developing, and intends to market, an apparatus which incorporates not only what is specifically disclosed by the present drawings but also incorporates an invention made by John E. Larrison. Such Larrison invention is disclosed in U.S. patent application Ser. No. 510,416 filed on even date herewith for a Multiface Wire Bonding Method and Tool. The disclosures of said application is hereby incorporated by reference herein as though set forth in full. Since the present application also has great utility not only in conjunction with the Larrison invention but also in conjunction with bonding wedges long employed in the ultrasonic wire bonding art, a conventional bonding wedge is shown in the present drawings and described herein.

As indicated above, and as described below in this specification and in the appended claims, applicant's invention resides in the apparatus and method whereby a predetermined tension is applied to the wire during actual application of the ultrasonic bonding energy. This tension, which has a predetermined magnitude, is applied to the wire after it is pressed by the bonding wedge. The tension may be applied before ultrasonic bonding energy is applied, and if so, the magnitude of the tension remains substantially unchanged, both before and after the vibration, until the wire has broken. The preferred means for accomplishing this, including the adjustable means for achieving a predetermined spring bias on the wire, will now be described. Except for the means for achieving the bias, the method of biasing, the sequence whereby the pulling is effected during application of ultrasonic energy, etc., the various individual components described below are the same as or highly similar to the prior art.

Figures 6, 9, 10:
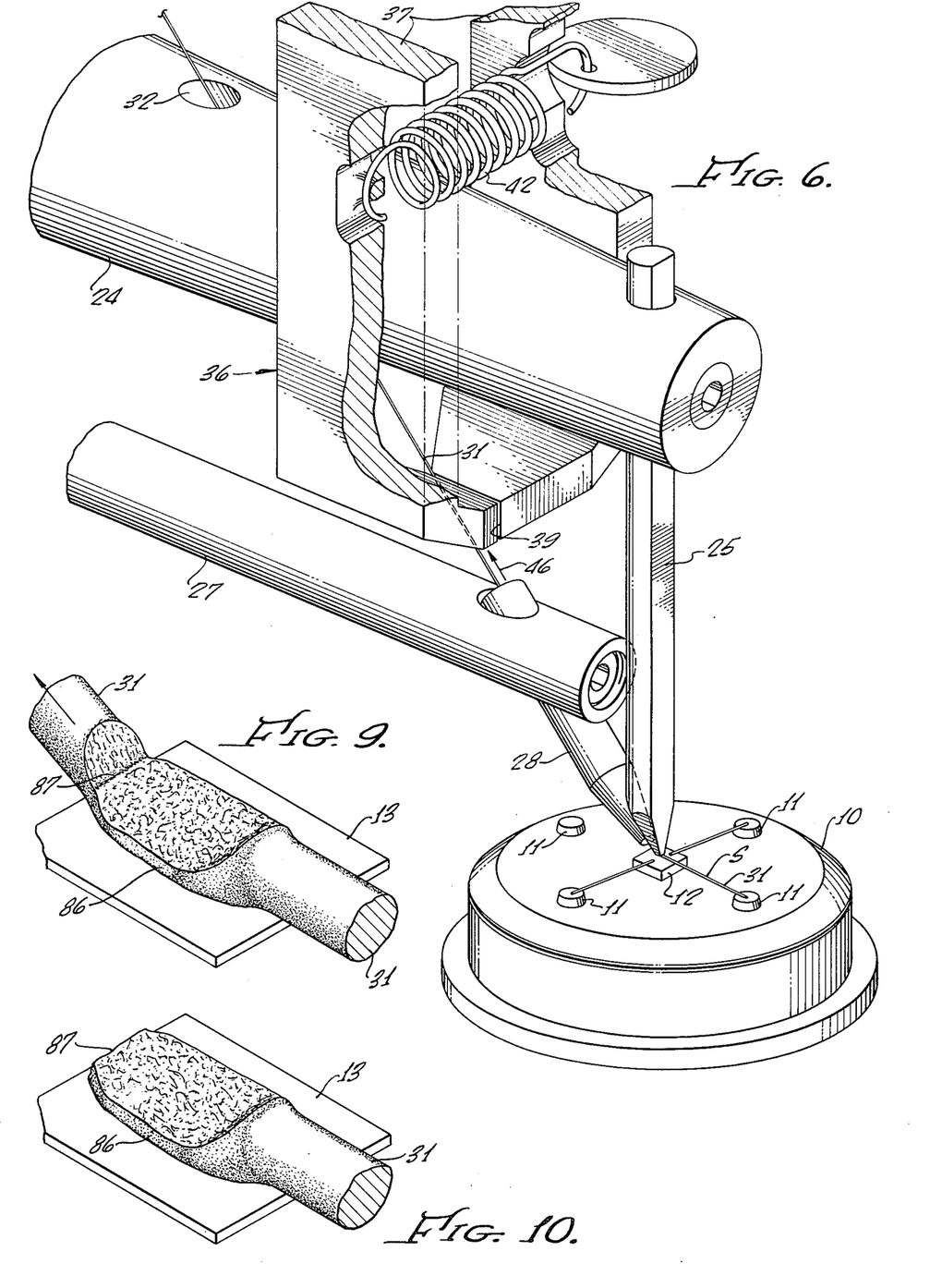
FIG. 6 is a greatly enlarged isometric view illustrating the lower right portion of the showing of FIG. 1, portions being broken away to show the spring bias between opposed jaws of the wire clamp.
FIG. 9 is a greatly enlarged isometric view showing a partially completed bond, prior to breaking of the wire.
FIG. 10 illustrates the completed bond after breaking of the wire.

Referring first to FIG. 6, there is shown at 10 a package header on which are provided a plurality of posts 11 mounted around a chip 12. The chip 12 is a semiconductor element incorporating large numbers of circuit components. Furthermore, the upper surface of the chip 12 incorporates a plurality of pads 13 (FIGS. 9 and 10) which are too small to be seen in FIG. 6. Each such pad 13 is connected to circuit components of chip 12. The purpose of the present invention is to connect, by means of electronically conductive wire, one of the posts 11 to associate one of the pads 13. The described methods and apparatus are particularly useful where such conductive wire has a diameter in excess of 0.002 inches, for circular cross-section wire, and are also useful for ribbon wire having a rectangular section that may be in the order of 0.002 × 0.006 inches.

It is to be understood that the wire may first be connected to the post and then to the pad, or else vice versa. Also, it is to be understood that the present invention is applicable to other types of circuit arrangements wherein it is desired to connect wire from one element to another.

It is to be understood that the upper end of each post 11, and the upper surface of each pad 13, is metal coated as is conventional in conjunction with ultrasonic bonding methods. Preferably, the metal in the coating is the same as the wire to be ultrasonically bonded thereto. In typical arrangements, the coatings are aluminum and the wire is also aluminum. The ultrasonic bonding then creates much frictional rubbing action which causes intermixing of the adjacent molecules of the wire and the pad, thereby creating an electrical and mechanical bond.

Figure 1:
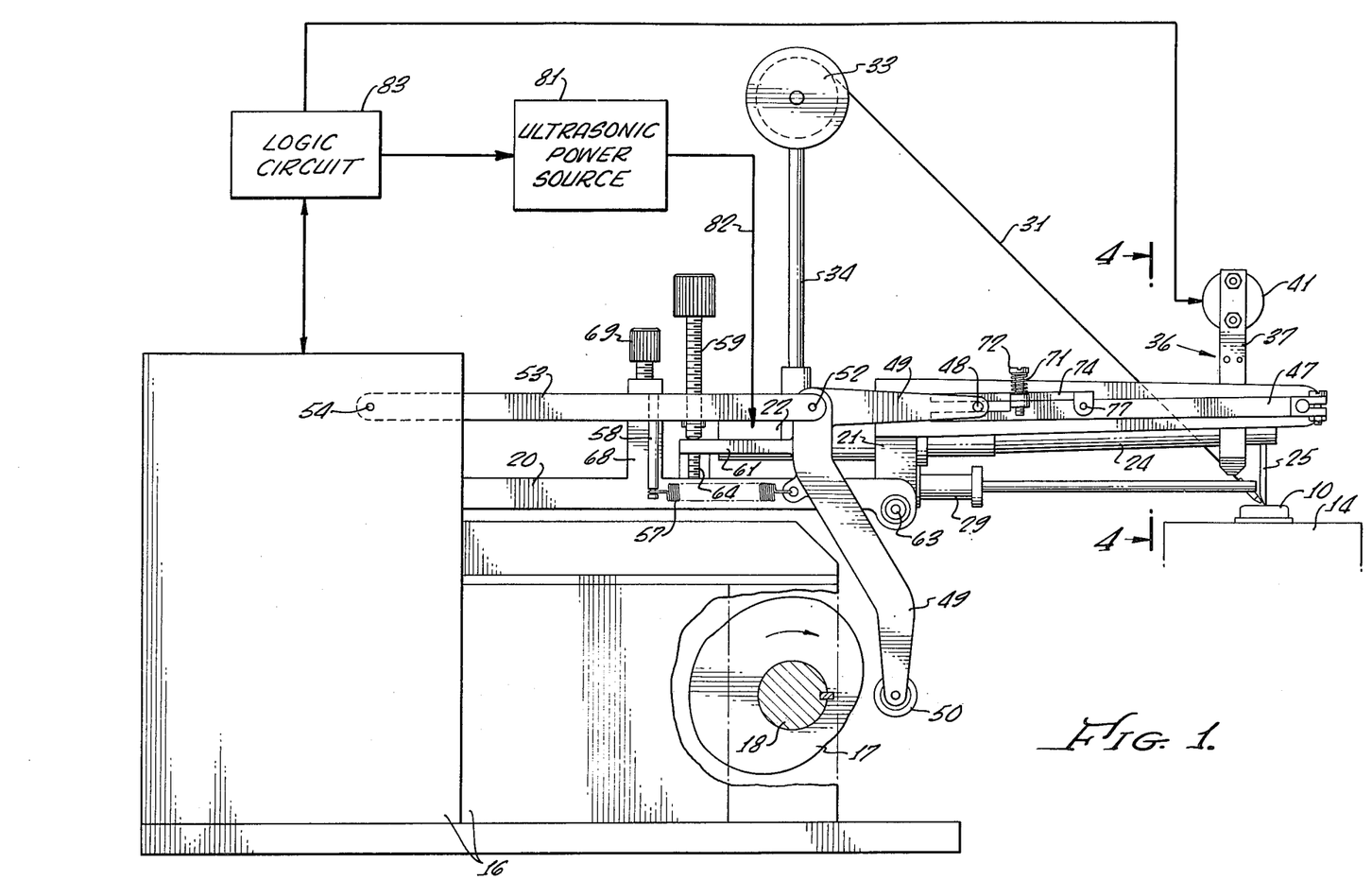
FIG. 1 is a side elevational view, partly schematic, of a wire bonding and breaking apparatus constructed in accordance with the present invention.

In the presently described apparatus, the package header 10 and associated parts is stationary, being supported on a support 14 (FIG. 1). The apparatus could be such, however, that the support is movable. In other words, instead of providing an apparatus wherein the part is stationary and the machine moves, the arrangement could be such that the machine is substantially stationary and the part moves.

Figures 2, 3, 3A, 4:
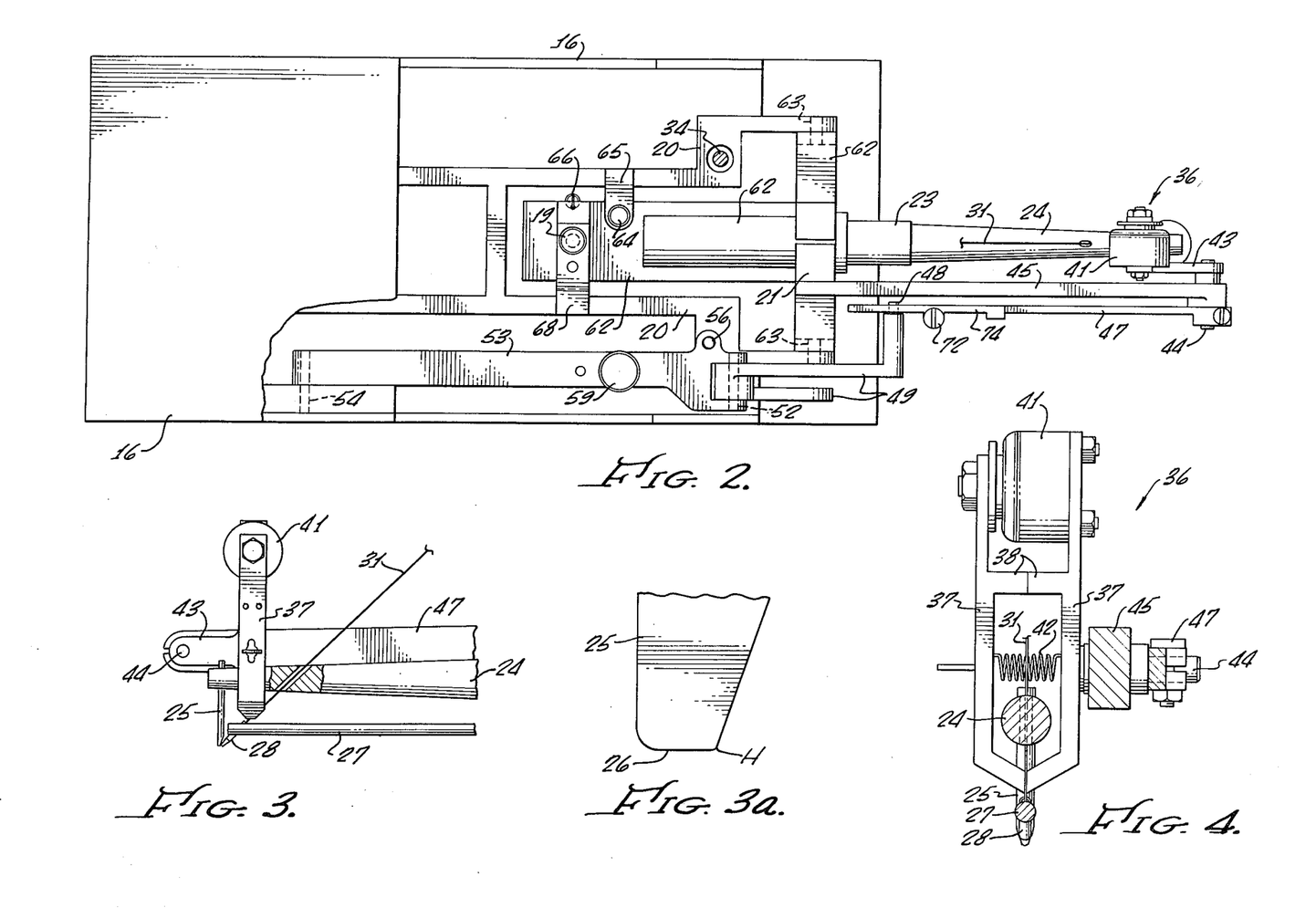
FIG. 2 is a top plan view of the showing of FIG. 1, but omitting a showing of the blocks containing electronic circuits.
FIG. 3 is a fragmentary side elevational view illustrating the front portion of the apparatus, showing the side not shown at the right in FIG. 1.
FIG. 3a is a side elevational view showing only the lower end or tip of the bonding wedge, being a greatly enlarged showing of the region illustrated at the extreme lower left in FIG. 3.
FIG. 4 is a vertical sectional view taken on line 4—4 of FIG. 1.

Referring next to FIGS. 1 and 2, there is shown a housing 16 containing a motor, cams, arms, etc., which are not necessary to an understanding of the present invention. Details of such mechanisms and associated transducer and clamp movements and supports (other than wire tensioning and sequencing) are substantially similar to the arrangements shown in the patents to Pennings U.S. Pat. Nos. 3,305,157 and 3,328,875. One of the cams, numbered 17, is part of the power arrangement which applies predetermined tension to the wire, such cam therefore being shown by various ones of the present drawings. The cam 17 is mounted on a camshaft 18 which is connected to be driven by the motor M (FIG. 5) under control means described hereinafter.

A support frame 20 (FIGS. 1 and 2) is mounted in housing 16, being suitably associated with actuating elements which cause it to move upwardly and downwardly, and also horizontally, as described by the operator of the apparatus. The movements of the support frame are preformed in conjunction with the part of the work 10–13 that is desired to operate upon. For example, and as stated below, when it is desired to replace the indicated package header 10 with a new one, the support frame 20 is elevated and a new package header is placed on the support 14.

Mounted at the right end of support frame 20 is a transducer frame 21 (FIG. 2) which supports in horizontal position an ultrasonic transducer 22. Such transducer is connected through a connector element 23 to a tool cone 24, the latter having (as best shown in FIG. 6) the bonding wedge 25 fixedly mounted in vertical relationship at the outer end thereof. When the transducer 22 is energized, it transmits ultrasonic vibrations through the connector 23 and the tool cone 24 to the bonding wedge 25. The lower surface 26 (FIG. 3a) of the wedge 25 then vibrates in a generally horizontal plane and in a direction generally parallel to the longitudinal axis of the tool cone.

Suitably mounted in parallel relationship below tool cone 24 is a wire guide support 27 having a tubular wire guide 28 mounted obliquely therethrough at the forward end thereof. For example, the wire guide support 27 may be threaded into a member 29 (FIGS. 1, 7 and 8) which is fixed to transducer frame 21. Details of one arrangement for mounting wire guide support 27 to frame 21 are disclosed in the above identified application of Larrison.

The wire to be bonded is given the reference numeral 31, and extends from the work upwardly through wire guide 28, thence through an opening 32 (FIG. 6) in tool cone 24, and thence to a reel 33. Such reel is supported, for example, on a post 34 mounted on support frame 20.

The clamp 36 for wire 31, best shown in FIGS. 4 and 6, comprises two first-class levers 37 which rock together about abutting ends of fulcrum arms 38. The lower ends of levers 37 bend toward each other to form vertical faces 39 (FIG. 6) which engage opposite sides of the wire 31 when the device 36 is in clamping condition. The upper ends of the lever members 37 are respectively connected to the two components of a solenoid 41. When the solenoid 41 is energized, the upper ends of levers 37 are pulled toward each other, causing rocking of the lever members about the ends of fulcrum arms 38 until the vertical faces 39 (FIG. 6) are spaced a short distance away from wire 31, thus freeing the wire. At all times when solenoid 41 is not energized, the lower ends of levers 37 are pulled toward each other by a helical tension spring 42 (FIGS. 4 and 6) thus shifting the faces 39 toward each other until they are in clamping engagement with opposite sides of the wire. It is an important feature of the present apparatus and method that the tension spring 42 may be much less strong than in prior-art devices of the type wherein the wire is broken by pulling thereon after making of the ultrasonic bond.

Figure 5:
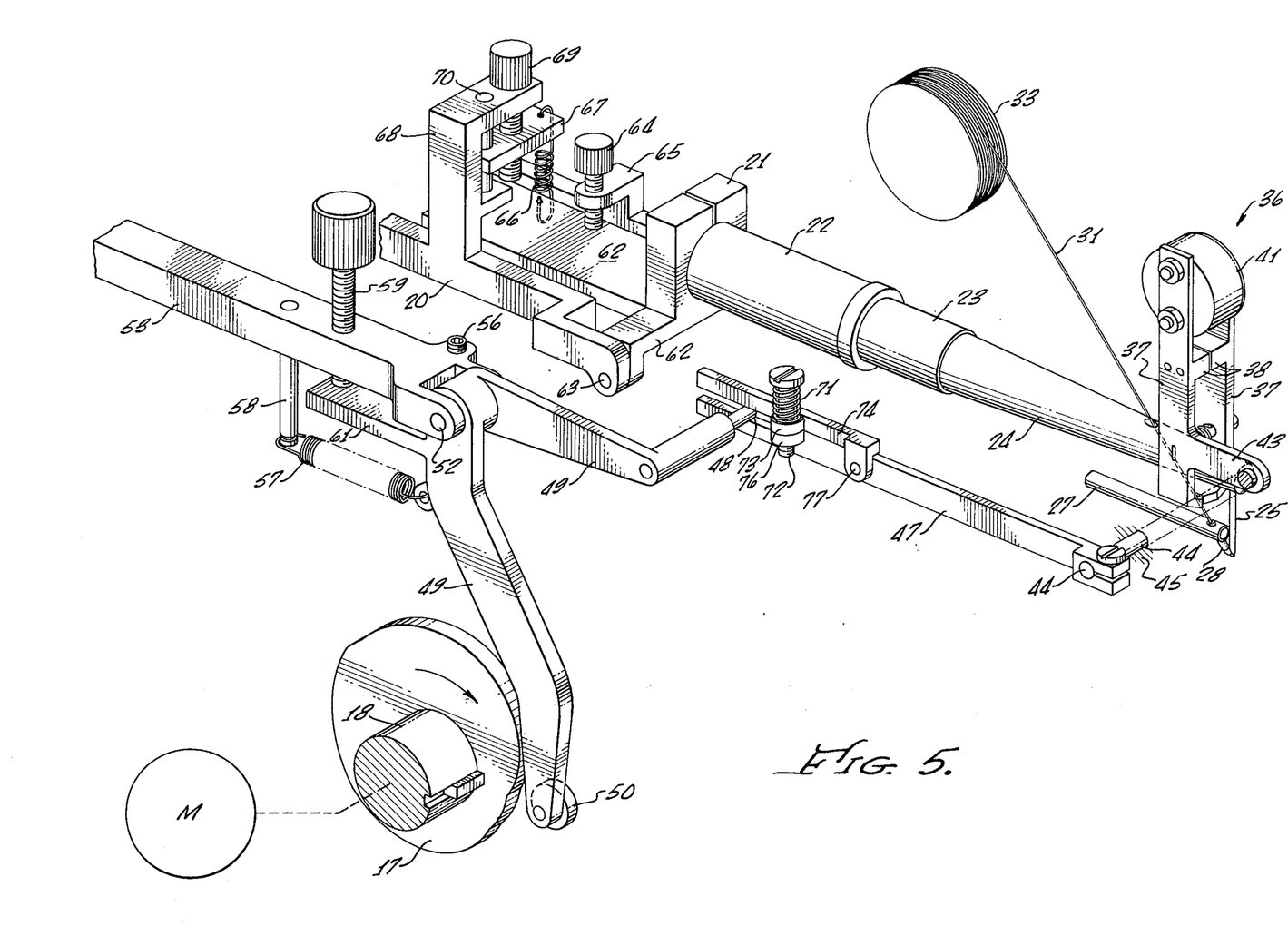
FIG. 5 is a partially exploded, diagrammatic view illustrating certain critical elements of the present apparatus.

As shown in FIG. 5, one of the levers 37 has integrally connected thereto a forwardly extending arm 43 in which is fixedly (non-rotatably) secured one end of a horizontal shaft 44. Such shaft 44 is rotatably supported in an end of bearing arm 45 best shown in FIG. 2, such arm being fixedly secured to one side of the transducer frame 21.

Referring, for example, to FIG. 5, it will be understood that if shaft 44 is rotated clockwise (as viewed from the rear end of shaft 44), arm 43 will also be rotated clockwise about the axis of shaft 44, which will raise the lower ends of the levers 37. Upon such clockwise rotation, assuming that the solenoid 41 is in deenergized condition so that the clamp is closed by spring 42, a tensile force will be applied to the wire 31 at the region between the clamp and the workpiece, as indicated by the arrow 46 in FIG. 6.

The indicated clockwise rotation of shaft 44 (FIG. 5) is effected by a horizontal crank 47 which is movably connected to a pivot pin 48 (on the bell crank) to one arm of a bell crank 49. A second arm of the bell crank extends downwardly and has mounted at the lower end therof a cam follower roller 50. When roller 50 is pushed forwardly (to the right as viewed in FIGS. 1 and 5) by the cam 17 on shaft 18, the thereof crank 49 pivots counterclockwise and therefore effects clockwise rotation of crank 47 (about the axis of shaft 44) to apply tension to the wire 31 as above stated.

Referring to FIG. 5 in particular, from which several parts have been omitted for clarity, the bell crank 49 is pivoted to the forward end of a support arm 53, the rear end of the arm being pivoted at 54 (FIGS. 1 and 2) to a component within housing 16 of the apparatus.

The outer (right) end of support arm 53 is supported adjustably on support frame 20, this being effected by means of a set screw 56 (FIGS. 2 and 5) which extends downwardly for engagement with the frame 20. To bias the bell crank 49 in a clockwise direction, so that the cam follower roller 50 tends to shift toward cam 17, a tension spring 57 is connected between the bell crank and a pin 58 on arm 53. The permitted amount of clockwise pivotal movement of bell crank 49 effected by spring 57 is determined by an adjustable headed stop screw 59 threaded through support arm 53 and having a lower end adapted to be engaged by a horizontal arm 61 that projects rearwardly from the bell crank.

During the present ultrasonic bonding and wire breaking operation, it is important that the lower surface 26 (FIG. 3a) of the bonding wedge 25 press against the upper surface of the wire 31 with a predetermined pressure. To achieve such predetermined pressure, and isolate it from the mechanisms which move the support frame 20, the transducer frame 21 is not rigidly connected to the support frame 20 but instead is pivotally associated therewith. It is to be noted that the frame 21 not only supports the transducer 22, tool cone 24, etc., but also supports the bearing arm 45 for the wire clamp 36 and its actuating crank 47.

Referring particularly to FIGS. 1, 2, and 5, the transducer frame 21 extends upwardly from and is fixedly associated or integral with a generally horizontal T-member 62. The ends of the cross arms of the T-members are pivoted at 63 to the forward ends of support frame 20, as best shown in FIG. 5. The amount of upward pivotal movement of the T-member 62 about pivots 63 is determined by a stop 64, such stop being shown as a headed screw (FIG. 5) which is threaded through a lug 65 on frame 20, the lower end of the stop being adapted to be engaged by the rearwardly extending stem of the T-member 62.

Adjustable means are provided to effect predetermined clockwise bias of the T-member 62, and thus of transducer frame 21 and associated elements, about the pivots 63. Such means cooperates with the weight of the transducer 22, tool cone 24, etc., in achieving the above-indicated downward force at the interface between surface 26 (FIG. 3a) and the wire. The means is illustrated to comprise a tension spring 66 (FIG. 5) which connects between the stem of T-member 62 and a plate 67 which is vertically adjustable relative to support member 20.

Stated more definitely, an F-member 68 is fixed to and extends upwardly from support frame 20 as shown in FIGS. 1, 2 and 5, having a headed screw 69 extended downwardly through the upper horizontal member thereof in non-threaded relationship relative to such upper member. The lower, threaded region of screw 69 is threaded through the plate 67, the result being that turning of the screw effects upward or downward adjustment of plate 67 to thus increase or decrease the tension of spring 66. To prevent rotation of the plate 67 about a vertical axis, a slide pin 70 (FIG. 5) is fixed in vertical relationship to the F-member 68, such pin extending loosely through an aperture in plate 67.

As indicated in section in FIG. 2, the post 34 for wire reel 33 is preferably mounted on the fixed portion of support frame 20, not on a pivoted member associated therewith. This is so that the weight of the wire in the reel will not be a factor in determining the downward pressure of the bonding wedge against the work. It is to be understood, however, that particularly in the case of small reels of wire it may in some instances be desirable or permissible to mount the reel on the pivoted element 62, for example.

DESCRIPTION OF THE MEANS FOR PRELOADING THE WIRE, OF THE CONTROL MEANS AND METHOD, AND OF CERTAIN CRITICAL RELATIONSHIPS

As above indicated, and in accordance with one important aspect of the present invention, means are provided to preload the wire 31 with a predetermined tension. Such means are preferably in the nature of a spring, as next described, but they could be pneumatic, hydraulic, magnetic, or a fixed weight, etc.

The spring is shown at 71, for example in FIG. 5, being a helical compression spring which is seated around the shank of a spring-adjustment screw 72. Stated more definitely, spring 71 is seated between the head of screw 72 and an apertured lug or ear 73 which is provided on a second-class lever 74. Screw 72 is not threadedly related to the lug 73, but instead freely movable relative thereto in an axial direction. The screw is threaded into a second lug 76 which is provided near the rearward end portion of crank 47 relatively adjacent pivot pin 48. One end of lever 74, namely the end relatively adjacent shaft 44, is pivoted by a pin 77 to an intermediate portion of crank 47, the relationship being such that lever 74 may pivot upwardly and downwardly relative to the crank. Pivot pin 48 is relatively loosely captured between the lower side of lever 74 and the upper side of the rebated rearward end of crank 47.

Figure 7:
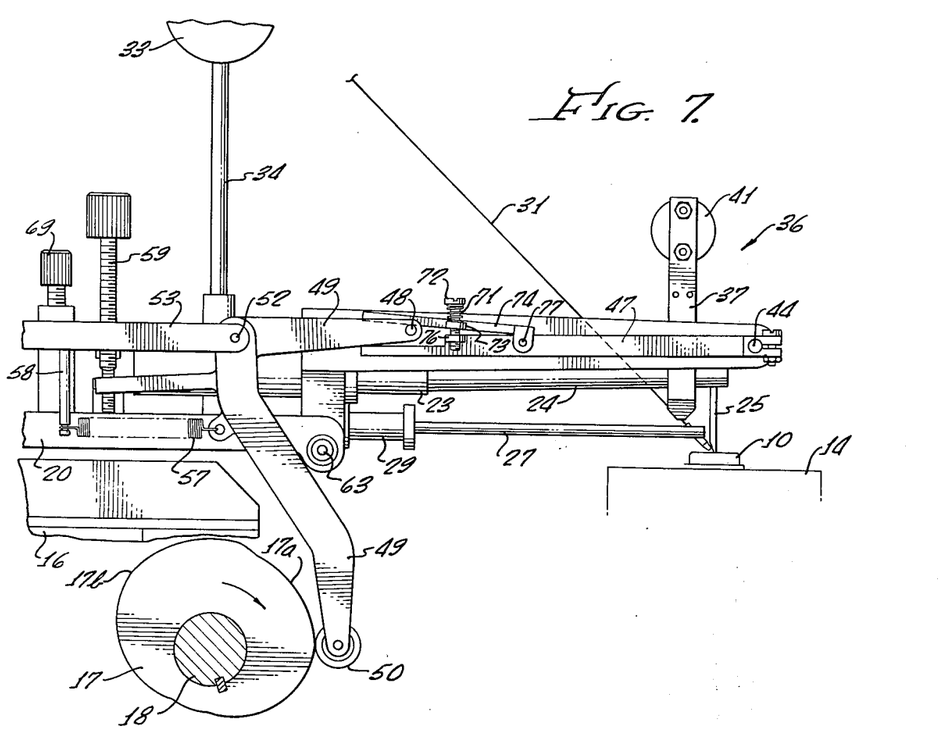
FIG. 7 is a side elevational view corresponding to the right portion of FIG. 1, and showing the positions of the parts while tension is being applied to the wire by the wire clamp and associated mechanism.

Referring to FIG. 7, let it be assumed that the bonding wedge 25 has been lowered to such position that its lower surface 26 (FIG. 3a) is pressing downwardly upon an upper surface of a wire 31, above a pad 13 on chip 12 as shown in FIG. 6. Let it also be assumed that the cam 17 is in such a rotated position that it is forcing cam follower roller 50 to the right, thus causing counterclockwise pivotal movement of bell crank 49 about pivot 52. Furthermore, let it be assumed that clamp 36 is in closed condition on wire 31, solenoid 41 being deenergized. The indicated counterclockwise pivotal movement of bell crank 49 does not lift operating crank 47 to any substantial extent since such element is held down by the tension of the wire portion between clamp 36 and the work (such force being communicated through shaft 44 described above). Instead, the second-class lever 74 is lifted, pivoted clockwise about its pivot pin 77, against the bias exerted by the preadjusted and prestressed compression spring 71. Stated otherwise, lug 76 remains fixed in position, and lug 73 (FIG. 5) slides upwardly around the shank of screw 73 to thus further compress the spring 71 between lug 73 and the head of the screw. As lever 74 is raised it exerts a clockwise moment upon crank 47 (and clamp 36) about the axis of shaft 44. This moment is transmitted from lever 74 to crank 47 via the compression of spring 71. This clockwise moment exerted by lever 74 produces the wire tension preload that is applied before and during vibration of the bonding wedge. The amount of the spring bias thus achieved is critically adjusted prior to the operation, as stated below.

As soon as ultrasonic energy is delivered to transducer 22 as described below, causing a scrubbing action of the bonding wedge 25 relative to the wire, the wire 31 breaks adjacent the bond. This releases the restraining force on crank 47, and permits it to pivot upwardly (clockwise) to the position shown in FIG. 8. The two lugs 73, 76, are then brought together, lever 74 again being parallel to crank 47. It is to be noted that the amount of this pivotal movement of crank 47 is accurately predetermined, so that the amount of shifting of the wire 31 away from the bond region is accurately known and controllable. In movement from the position of FIG. 7 to the position of FIG. 8, bell crank 49 does not rotate because roller 50 is engaged with a portion 17a of cam 17, which portion is circular and concentric with the still rotating cam shaft 18.

Referring next to FIG. 1, an ultrasonic power source is represented schematically at 81, being connected to the transducer 22 as shown at 82. Power source 81 and transducer 82 are elements well known in the art, and are adapted to cause vibration of tool cone 24 (longitudinally of the axis thereof), and thus of bonding wedge 25 at ultrasonic frequency. The frequency of the ultrasonic motion is typically about 40–60 kHz. The wire is so oriented relative to the tool, preferably, that the ultrasonic motion is parallel to the axis of the wire. The resulting ultrasonic scrubbing motion makes the molecular weld and bond, in a very short period of time, for example about 0.1 second. The downward pressure on the bonding wedge varies throughout a wide range, depending upon such factors as wire size and type, and upon the area of the lower surface of the bonding wedge, and may range (for example) between about 25 grams and about 600 grams. The amplitude (peak to peak) of the ultrasonic scrubbing motion of the lower end of the bonding wedge also varies with the size of the wire, and other factors and is typically in the order of 50–300 microinches.

Again referring to FIG. 1, the power source 81 is controlled, and other elements of the apparatus are controlled, by logic and control circuitry schematically represented at 83. This circuitry is associated not only with power source 81 but with the motor M (FIG. 5) for cam shaft 18, for the actuating elements which adjust the support frame 20, and for the solenoid 41 of the wire clamp 36. The preferred manner of operation of the logic circuitry is described below under the subheading "Operation". Although the illustrated logic control circuitry is preferred for automatically sequencing various steps, it will be readily appreciated that the various operations can all be manually controlled, if deemed necessary or desirable.

The present method and apparatus do not in any sense diminish the quality of the ultrasonic bond made between wire 31 and the underlying element, for example an underlying pad 13 (FIG. 9) on semiconductor chip 12 (FIG. 6). One such completed bond is shown at 86 in FIGS. 9 and 10. Thus, the entire apparatus is so adjusted as to effect an optimum-quality bond between wire 31 and the pad 13 (or a post 11, for example). This is done in ways well known in the art, by proper selection of the bonding wedge 25, by application of the correct ultrasonic power from source 81, by application of the correct downward load on the bonding wedge 25, etc. Such downward load on the wedge 25 (and thus on the upper surface of the wire 31 being bonded) is determined, as described above, by turning the screws 69 (FIG. 9) to therefore adjust the tension of tension spring 66. All of these factors are related to the diameter of the wire 31, to the material of which the wire 31 is made, to the wire hardness, etc.

It is emphasized that the amount of downward travel of the wedge 25 during the ultrasonic bonding operation is a function of various factors, including power application, area of the lower end of the wedge, etc. These factors are always so adjusted that the lower end of the wedge does not penetrate clear through the wire and engage the underlying work (such as pad 13). There is thus no danger that the underlying pad 13 will be damaged. It is to be noted that the stop 64 (FIG. 5) is normally not engaged at any time during the ultrasonic bonding operation, even at the extreme end thereof, this stop being instead adapted to facilitate positioning of the apparatus as stated below.

After everything has been adjusted for achievement of the optimum ultrasonic bond, having the optimum thickness and other characteristics, the pressure exerted by the wire preload spring 71, and the tension exerted by wire clamp spring 42 (FIG. 6) are determined in the following critical manner.

The size of the preload spring 71, and the adjustment of its associated screw 72, are so set that the wire 31 will not be pulled from beneath the bonding wedge at any time, either prior to or during the bonding operation. Preload is determined by the amount of compression of spring 71 with the lever 74 in the position shown in FIG. 5 and 8, together with the magnitude of motion of lug 73 and lever 74 between the two positions shown in FIGS. 7 and 8. Lengths of the various lever arms and weights of the parts are also factors of the preload magnitude. Spring compression is adjusted by turning screw 72 in one direction or the other. The preload tension on the wire is also such that the wire 31 will not break prior to bonding. The preload is caused to be such that the wire 31 will break during the actual bonding operation, by which is meant during actual delivery of ultrasonic energy from power source 81 to transducer 22 and thus to the bonding wedge. Preferably, the preload is such that no more tension is applied than is necessary to insure breaking during the production run. The clamp spring 42 is selected of such strength that the surfaces 39 of the wire clamp will grip the wire with the force requisite to apply such tension to the wire portion between the wire clamp and the work, without slipping or sliding, the tension of spring 42 again being the minimum amount necessary to achieve this result. Because the application of tension during delivery of ultrasonic energy vastly reduces the tension which must be applied to the wire in order to break it, the tension of spring 42 may be relatively weak in comparison to prior art pulling devices, as above noted. This minimizes the danger of any injury to the wire 31. It will be readily appreciated the force exerted by clamp spring 42 may be made adjustable by well known means if deemed necessary or desirable. The adjustable means of spring 71 may be employed, for example.

The wire breaks at the break region indicated at 87 in FIGS. 9 and 10, such break region being relatively adjacent the "heel" H of the bonding wedge as shown in FIG. 3a. There is, therefore, no tail on the bonded wire.

The exact preload values are functions of such things as wire material, type and hardness, the angle of the wire 31 relative to the work (that is to say the "pulling angle") and which is shown as being about 45 degrees in the present disclosure, the shape of the lower end of the bonding wedge 25, the amplitude and frequency of the ultrasonic vibration and the amount of downward pressure exerted by the bonding wedge.

In setting up the apparatus, and to determine the critical preload relationships, the spring 71 may first be set to a very low-pressure value. A trial bond is then made, and it is noted that the wire 31 does not break. Then, progressively, the screw 72 is turned down to further compress ths spring 71 to thereby progressively increase the pressure of the compression spring 71. Periodically, as the spring pressure is thus increased by turning the screw 72, trial bonds are made. It is then noted when the wire actually breaks during the continuance of the application of ultrasonic energy. The spring pressure is then made a little greater than this amount which achieves breakage of the wire, in order to insure that such breakage will occur at all times during the production run. After the setting of spring 71 is thus determined, a tension spring 42 is selected and inserted in the wire clamp 36. A spring 42 is chosen which has a tensile force such that it exerts only a little more than the amount of tension required to grip the wire in order to achieve the requisite wire tension (without slipping). It is thus assured that little or no damage will occur to the wire as a result of gripping by the wire clamp 36. The described empirical setting of spring 71 may be performed with a clamp spring 42 that has a tension somewhat greater than the minimum required to grip the wire, because any damage to the wire employed for initial adjustments is of no consequence.

As one example of the type of damage which may occur to the wire if the clamping pressure is too great, a softer wire 31 may actually be somewhat flattened between the clamp jaws in the clamping operation. This partial flattening is extremely undesirable since it changes the character of the wire in that the bonding wedge may then operate upon a somewhat flattened part instead of a cylindrical part. Thus, the machine operation is disturbed to a very substantial extent. Furthermore, too large a pressure of the clamp jaws may effect undesirable stress concentrations in the wire that will be later bonded to a chip.

Surprisingly, the application of the predetermined tension to the wire 31 during application of ultrasonic energy does not in any way diminish the quality of the resulting bond. It is believed that one reason why the bond is not diminished in quality is that the heel H (FIG. 3a) of the wedge 25, being relatively sharp, tends to isolate the bond region from the wire portion to which the tension is applied. The tension is applied to the wire adjacent the bond wedge heel H. The heel H results in the formation of the region 87 shown in FIGS. 9 and 10. Also, as noted above, the wire breaks off at the heel region 87 to form the desired tailless bond.

Since the wire breaks during the application of ultrasonic energy, and since the energy is only applied for a very short time (for example about 0.1 second), no time is required to break the wire after the bond is made. It is within the scope of the invention to apply tension to the wire during application of the ultrasonic energy, instead of immediately prior to or concurrently with the application of such energy.

OPERATION

Referring to FIG. 6, and for purposes of illustration, let it be assumed that the apparatus and method are to be employed in bonding a section "S" of wire between the rightmost post 11 and a pad 13 (FIGS. 9 and 10) on semiconductor chip 12.

The support frame 20 is first adjusted so that wedge 25 is in an elevated position, excessive downward pivoting of the ultrasonic apparatus and the wire clamp then being prevented by the stop screw 64 (FIG. 5). While everything is thus "up", the package header 10 is positioned on support 14 in such rotated position that a line between the rightmost post 11 and the chip 12 lies generally in a vertical plane containing the axes of the ultrasonic elements 24 and 25.

Frame 20 is then shifted until the lower surface of the bonding wedge 25 is in a first "search" position, relatively adjacent the upper end of the post 11 but spaced slightly thereabove. The operator, looking through a microscope, then effects fine positioning of the work until the bonding wedge is directly over the post. The wire is being held in position under the surface 26 of the bonding wedge, being gripped by clamp 36, of which the solenoid is de-energized. Thereafter, the frame 20 is lowered slightly to cause the wedge to clamp the wire 31 between the lower wedge surface and the upper surface of the post.

The wire clamp solenoid 41 is then energized to open the clamp 36, but the wire remains in position because of the clamping pressure applied between the wedge and the post. Ultrasonic power source 81 is then applied to effect the ultrasonic bond. Because of the fact that the wire clamp 36 is released during this step, there is no breaking of the wire adjacent the bond.

Frame 20 is then operated to lift the wedge 25 off the completed bond and to move the wedge to a second search position generally above the pad 13 on chip 12. As the apparatus thus moves, the wire strings out from the reel, through the wire guide 28. While the apparatus is in such second search position, the operator positions the package header 10 until the bonding wedge is directly above the pad 13. The frame 20 is then lowered to engage the lower end of wedge 25 with the upper surface of the underlying wire, pressing the wire against the pad. Then, solenoid 41 is deenergized to thereby permit the spring 42 to close the wire clamp 36 on the wire. The cam 17 then operates to pivot the bell crank 49 counterclockwise as described above relative to FIG. 7, thereby applying preload tension via the spring 71 to tension the wire region between the clamp and the work. The wire being thus tensioned in the predetermined manner and with the predetermined magnitude of tensile force as set forth above, the ultrasonic generator 81 is fired to effect the ultrasonic bond and also to effect (at some point during the bonding step) breaking of the wire at the break line 57 indicated in FIGS. 9 and 10, the actual break being shown at the left in FIG. 10. During the ultrasonic vibrations of bonding wedge and wire, the magnitude of the preload tensile force remains unchanged, until the wire has broken.

Wire feeding takes place in two parts. The first part of the feeding occurs after the first bond and while the tool is being pulled back toward the second bond position. During this time the wire clamp 36 is opened by energizing solenoid 41 and causing clockwise pivotal movement of the crank 47 to a position somewhat above that shown in FIG. 8. This moves the clamp jaws relative to the wire toward the reel 33. Then the solenoid is de-energized to close the wire clamp 36. After making the second bond and tensioning the clamped wire until it breaks, the tool is slightly lifted (and the wire is laterally shifted if a bonding wedge of the type shown in the Larrison application is employed). Then counterclockwise pivotal movement of crank 47 is effected to pull wire from the reel 33 and to push wire through the wire guide 28 such that the end of the wire is directly beneath the lower surface of the bonding wedge 25.

Figure 8:
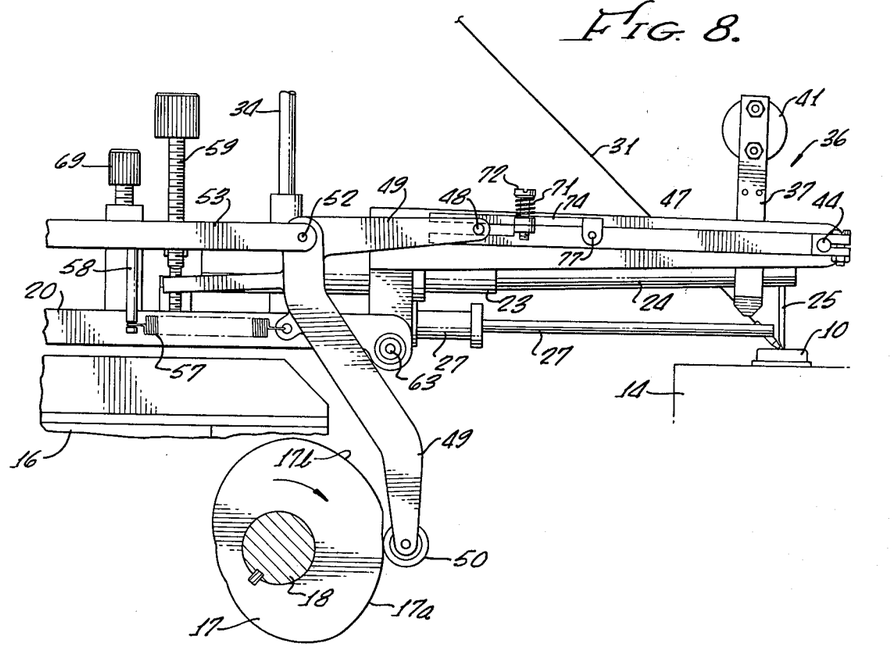
FIG. 8 corresponds to FIG. 7 but shows the positions of the parts after the wire has broken in response to both the predetermined tension and the application of ultrasonic bonding energy.

With the illustrated apparatus, the additional clockwise pivotal movement of crank 47 for the wire feeding is effected by a high portion 17b of the cam, as shown in FIGS. 7 and 8, such portion being higher than the portion 17a which engages the cam follower roller 50 during the wire preloading and breaking portion of the cycle. Thus, assuming that the wire breaks when the cam 17 is in the position shown in FIG. 8, the clockwise rotating cam will substantially immediately cause the high portion 17b to engage roller 50 and cause counterclockwise pivotal movement of bell crank 49 to lift crank 47, thus rotating the open clamp 36 clockwise. Solenoid 41 is now de-energized to close the clamps. Additional clockwise rotation of the cam permits the bell crank 49 to rotate clockwise, under the bias exerted by spring 57, until arm 61 engages the lower end of stop screw 59. Such stop screw 59 is adjustable to determine the exact position of the forward end of the wire. This additional clockwise rotation of the cam 17 rotates the now closed clamp 36 counterclockwise to position an additional length of wire for the next bonding operation.

The foregoing detailed description is to be clearly understood as given by way of illustration and example only, the spirit and scope of this invention being limited solely by the appended claims.

I claim:

1. A method of effecting ultrasonic bonding of wire to an object and of breaking the wire at the ultrasonic bond, which method comprises:
   a. clamping a wire between an object and an ultrasonic bonding tool,
   b. applying to said bonding tool sufficient ultrasonic energy to vibrate the same at an ultrasonic frequency and thereby effect an ultrasonic bond between said wire and said object, and
   c. applying tension to said wire during at least a portion of the time period during which said ultrasonic energy is being applied to said bonding tool as recited in step (b),
   said tension being directed away from said bonding tool and being transmitted through part of said wire to the wire portion immediately adjacent said tool,
   said tension being sufficiently low to prevent slipping of said wire from between said bonding tool and said object,
   said tension being sufficiently low that said wire would not break if said ultrasonic energy were not applied,
   said tension being sufficiently high that said wire breaks immediately adjacent said ultrasonic bond, during said time period when ultrasonic energy is being applied to said bonding tool,
   said breaking of said wire being the result of both said application of ultrasonic energy and said application of tension.

2. The invention as claimed in claim 1, in which said method further comprises applying said ultrasonic energy to said bonding tool in such manner that said tool vibrates in a direction generally parallel to the clamped portion of said wire.

3. The invention as claimed in claim 1, in which said method further comprises effecting said application of tension by means of a wire clamp, and so adjusting said clamp that the clamping pressure applied thereby to said wire is adequate to prevent slippage of said clamp relative to said wire when said tension is applied to said wire, but is much less than the clamping pressure which would need to be applied by said clamp to said wire in order to effect nonslip tension of said wire adequately to cause breaking thereof in the absence of said application of ultrasonic energy.

4. The invention as claimed in claim 1, in which said method further comprises applying said tension by means of a wire-preload element, and so adjusting said wire-preload element that said wire is tensioned a precisely predetermined amount.

5. The invention as claimed in claim 4, in which said method further comprises employing a spring as said wire-preload element.

6. The invention as claimed in claim 1, in which said method further comprises performing said ultrasonic bonding step in such manner that no portion of said bonding tool engages said object.

7. The invention as claimed in claim 1, in which said method further comprises employing as said ultrasonic bonding tool a tool having a relatively sharp heel portion disposed between the main bond region and the wire portion to which said tension is applied, said heel substantially isolating said bond region from said tension applied to said wire.

8. The invention as claimed in claim 1, in which said method further comprises adjusting the clamping pressure exerted by said bonding tool on said wire, in such manner as to result in an optimum ultrasonic bond and without causing excessive squashing of the bond region.

9. The invention as claimed in claim 1, in which said method further comprises commencing said application of tension to said wire prior to commencement of said application of ultrasonic energy.

10. The invention as claimed in claim 1, in which said wire has a diameter in excess of 0.002 inch.

11. The invention as claimed in claim 10, in which said wire is formed of aluminum.

12. A method of bonding a wire to an element in a semiconductor circuit, and simultaneously breaking such wire immediately adjacent the bond, which method comprises:
   a. disposing a portion of a metal wire adjacent an element for bonding thereto,
   b. pressing the end of an ultrasonic bonding wedge downwardly on said wire portion to force said wire portion into pressure engagement with said element,
   the amount of pressure thus exerted by said wedge on said wire portion being predetermined in a manner correlated to the type, size and hardness of said wire, and the area of the end of said wedge, to permit creation of an ultrasonic bond between said wire portion and said element,
   c. applying to said wedge ultrasonic energy to vibrate said wedge at a frequency and amplitude and for a time period to create an ultrasonic bond between said wire portion and said element,
   d. pulling on said wire during at least part of said time period during which ultrasonic energy is applied as recited in step (c), thereby tensioning said wire adjacent said wire portion, and e. causing the amount of tension thus applied to said wire by said pulling to be sufficient to break said wire during said time period.

13. The invention as claimed in claim 12 wherein said pulling is initiated before said application of ultrasonic energy is not varied until the wire breaks.

14. The invention as claimed in claim 12, in which said method further comprises employing as said wedge a wedge the lower end of which has a heel, and causing said heel to be relatively adjacent the region of said wire to which tension is applied as recited in step (d), whereby said heel substantially isolates the bond region from said tension.

15. The invention as claimed in claim 14, in which said pulling is effected in a direction which is at a substantial angle to the plane of the bond region.

16. The invention as claimed in claim 12, in which said method further comprises causing the amount of tension applied to said wire as recited in step (d) to meet all of the following requirements:

a. it is sufficiently low that said wire will not be pulled from between said wedge and said element, b. it is much lower than the tension required to break said wire in the absence of application of ultrasonic energy to said wedge.

17. The invention as claimed in claim 12, in which said pulling recited in step (d) is effected by closing a wire clamp on said wire and then moving said clamp a predetermined distance in a direction away from the bond region.

18. The invention as claimed in claim 17, in which said method further comprises causing the closing force of said clamp on said wire to be sufficiently low to prevent flattening of said wire or damage thereto.

19. The invention as claimed in claim 18, in which said closing force is near the minimum necessary to prevent slipping of said clamp along said wire when said clamp is moved.

20. The invention as claimed in claim 12, in which said moving of said clamp is effected by biasing said clamp in a direction away from the bond region, with a sufficient bias force to create said tension recited in clause (e).

21. The invention as claimed in claim 20, in which said biasing is effected by a preloaded spring.

22. The invention as claimed in claim 12, including means for preselecting the magnitude of tension applied to said wire.

23. Apparatus for making an ultrasonic wire bond to a semiconductor circuit, and simultaneously breaking the wire adjacent said bond, which apparatus comprises:

a. a bonding tool, b. means to clamp said tool down on a wire with predetermined pressure adapted to aid in creation of a good ultrasonic bond between said wire and an underlying portion associated with a semiconductor circuit, c. means to vibrate said tool at an ultrasonic frequency, and with sufficient amplitude and in such direction and for a sufficient time period, that a good ultrasonic bond is made between said wire and said underlying portion, and d. means for pulling on said wire during at least part of said time period, in a direction away from said bond, for creating in said wire immediately adjacent said bond a tension which is adequate in conjunction with said ultrasonic vibration to break said wire.

24. The apparatus of claim 23 wherein said tool has a bonding surface formed with a relatively sharp heel.

25. The invention as claimed in claim 23, in which said means recited in clause (d) is adapted to create in said wire a tension much less than that which would be necessary for breaking of said wire in the absence of said ultrasonic vibrations.

26. The invention as claimed in claim 23, in which said means for pulling on said wire includes preload means to apply a predetermined tension to said wire.

27. The invention as claimed in claim 26, in which said preload means applies said tension prior to commencement of said time period.

28. The invention as claimed in claim 26, in which said preload means includes a spring.

29. The invention as claimed in claim 23, in which said pulling means includes a wire clamp and means to bias said wire clamp in a direction away from the bond area, said wire clamp being set to grip said wire without flattening thereof or injury thereto.

30. The invention as claimed in claim 29, including a crank which is adapted to be actuated to effect said pulling on said wire, actuating means connected between said wire clamp and said crank, means for providing a resilient connection between said actuating means and said crank, said resilient connection being adapted to apply predetermined tension to said wire of a manitude too small to break the wire when it is not being vibrated and sufficiently great to break the wire when it is being vibrated by said tool.

31. The invention as claimed in claim 30, in which said resilient connection includes a spring, and means to adjust the bias created by said spring.

32. The invention as claimed in claim 23, in which said means recited in clause (c) includes an ultrasonic generator, in which said means recited in clause (d) includes a solenoid-operated wire clamp and also includes bias means to bias and clamp in a direction away from the bond area, and in which control means are provided to first effect clamping of said tool down on said wire as recited in clause (b), then to load said bias means to bias said clamp in said direction away from the bond area, then to fire said ultrasonic generator, and then to release said clamp after breaking of said wire.

33. The method of bonding a filamentary wire to a substate comprising the steps of pressing the wire between the substrate and an ultrasonic bonding tool, vibrating said tool by applying ultrasonic energy thereto, and while said tool is vibrating by said application of energy, applying a tension to said wire, said tension having a magnitude less than the force needed to break said wire when said ultrasonic energy is not applied and greater than the force needed to break said wire when said ultrasonic energy is applied.

34. The invention as claimed in claim 12, in which said wire has a diameter in excess of 0.002 inch.

35. The invention as claimed in claim 34, in which said wire is formed of aluminum.

36. The invention as claimed in claim 33, in which said wire has a diameter in excess of 0.002 inch.

37. The invention as claimed in claim 36, in which said wire is formed of aluminum.

* * * * *

UNITED STATES PATENT OFFICE
CERTIFICATE OF CORRECTION

PATENT NO. : 3,954,217
DATED : May 4, 1976
INVENTOR(S) : Michael C. Smith

It is certified that error appears in the above-identified patent and that said Letters Patent are hereby corrected as shown below:

Column 2, line 23, put quotes around "larger"; line 25, put quotes around "larger"; line 32, put quotes around "pulling"; line 48, put quotes around "scissors"; line 52, put quotes around "Tailless"; line 55, change "competion" to --- completion ---.

Column 5, line 50, change "described" to --- desired ---.

Column 6, line 63, change "therof" to --- thereof ---; line 65, delete [thereof] and insert after "the" and before "crank" --- bell ---.

Column 7, line 67, after "indicated" delete [in section].

Column 10, line 29, change "FIG." to --- FIGS. ---; line 55, after "appreciated" and before "the" insert --- that ---; line 57, change "adjustable" to --- adjustment ---; line 62, put quotes around "tail".

Column 12, line 33, put quotes around "search".

Column 15, line 8 (line 3 of claim 13), after "energy" and before "is" insert --- and ---.

Column 16, line 30 (line 8 of claim 30), change "manitude" to --- magnitude ---; line 40 (line 5 of claim 32), change "and" to --- said ---; line 49 (line 2 of claim 33), change "substate" to --- substrate ---.

Signed and Sealed this

Twenty-seventh Day of July 1976

[SEAL]

Attest:

RUTH C. MASON
Attesting Officer

C. MARSHALL DANN
Commissioner of Patents and Trademarks